(12) United States Patent
Kim et al.

(10) Patent No.: US 7,446,367 B2
(45) Date of Patent: Nov. 4, 2008

(54) RELIABLE GAP-FILLING PROCESS AND APPARATUS FOR PERFORMING THE PROCESS IN THE MANUFACTURING OF SEMICONDUCTOR DEVICES

(75) Inventors: Yong-kyu Kim, Osan-si (KR); Jin-ho Jeon, Suwon-si (KR); Kyoung-soo Kwon, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 141 days.

(21) Appl. No.: 11/442,300

(22) Filed: May 30, 2006

(65) Prior Publication Data
US 2007/0026630 A1 Feb. 1, 2007

(30) Foreign Application Priority Data
May 30, 2005 (KR) .................. 10-2005-0045768

(51) Int. Cl.
*H01L 27/108* (2006.01)
*H01L 29/76* (2006.01)
*H01L 29/94* (2006.01)
*H01L 31/119* (2006.01)

(52) U.S. Cl. .................. 257/310; 257/410; 216/60; 438/424

(58) Field of Classification Search ................ 257/310, 257/410, 411; 216/60, 75; 438/424, 430
See application file for complete search history.

(56) References Cited

U.S. PATENT DOCUMENTS 5,980,767 A * 11/1999 Koshimizu et al. ........... 216/60
6,660,127 B2 * 12/2003 Nallan et al. ........... 156/345.48
7,077,973 B2 * 7/2006 Buxbaum et al. ............ 430/5
7,136,173 B2 * 11/2006 Wang .......................... 356/636
2004/0266218 A1 12/2004 Kwon
2004/0266221 A1 12/2004 Kim

FOREIGN PATENT DOCUMENTS

| JP | 2005-026656 | 1/2005 |
|---|---|---|
| KR | 1999-0058999 | 7/1999 |
| KR | 100230812 B1 | 8/1999 |
| KR | 100257903 B1 | 3/2000 |
| KR | 1020050000871 A | 1/2005 |
| KR | 1020050002317 A | 1/2005 |
| KR | 1020050003011 A | 1/2005 |

* cited by examiner

*Primary Examiner*—Phuc T Dang
(74) *Attorney, Agent, or Firm*—Volentine & Whitt, PLLC (57) ABSTRACT

A reliable gap-filling process is performed in the manufacturing of a semiconductor device. An apparatus for performing the gap-filling process includes a chamber in which a wafer chuck is disposed, a plasma generator for generating plasma used to etch the wafer, an end-point detection unit for detecting the point at which the etching of the wafer is to be terminated, and a controller connected to the end-point detection unit. The end-point detection unit monitors the structure being etched at a region outside the opening that is to be filled, and generates in real time data representative of the layer that is being etched. As soon as an underlying layer is exposed and begins to be etched, an end-point detection signal is generated and the etching process is terminated. In the case in which the layer being etched is an oxide layer, a uniform etching is achieved despite any irregularity that exists in the thickness to which the oxide layer is formed.

8 Claims, 9 Drawing Sheets

Fig. 1

(Conventional Art)

Fig. 2

(Conventional Art)

Fig. 3

(Conventional Art)

Fig. 4

(Conventional Art)

Fig. 15

RELIABLE GAP-FILLING PROCESS AND APPARATUS FOR PERFORMING THE PROCESS IN THE MANUFACTURING OF SEMICONDUCTOR DEVICES

BACKGROUND OF THE INVENTION

Field of the Invention

The present invention relates to a method of and an apparatus for filling an opening, such as a shallow trench or a contact hole, in the manufacturing of semiconductor devices or the like.

The manufacturing of semiconductor devices typically includes a Shallow Trench Isolation (STI) process in which shallow trenches are formed in a substrate to isolate active regions of the device from one another. The shall trench isolation process is widely used to ensure that the field oxide layer remains stable even when the design rule of the semiconductor device is relatively small and to prevent the forming of a bird's beaks which would otherwise reduce the active regions of the device. Thus, such a shallow trench isolation process is considered an especially useful technique in the manufacturing of ultra-high integrated semiconductor devices.

However, a trench formed by an STI process in the manufacture of a highly integrated semiconductor device has a high aspect ratio. In this case, there is a likelihood that voids will form in the trench when the trench is buried with the oxide layer. As a result, the STI structure will have poor insulating characteristics. Furthermore, the gates that are subsequently formed as spaced apart from each other across the trench may be shorted. Therefore, a gap-filling process of forming and etching a primary oxide layer has been proposed as a way to solve these problems.

Figure 1:
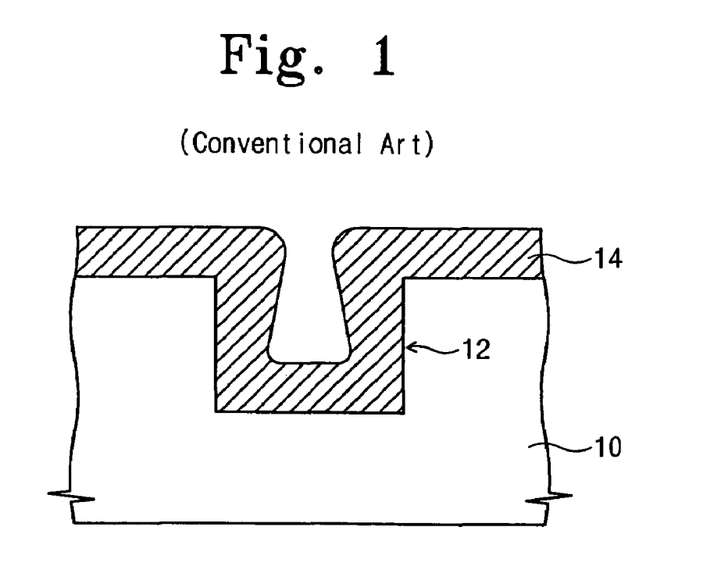
FIGS. 1 to 3 are each a cross-sectional view of part of a substrate and together illustrate a conventional gap-filling process.
Figure 2:
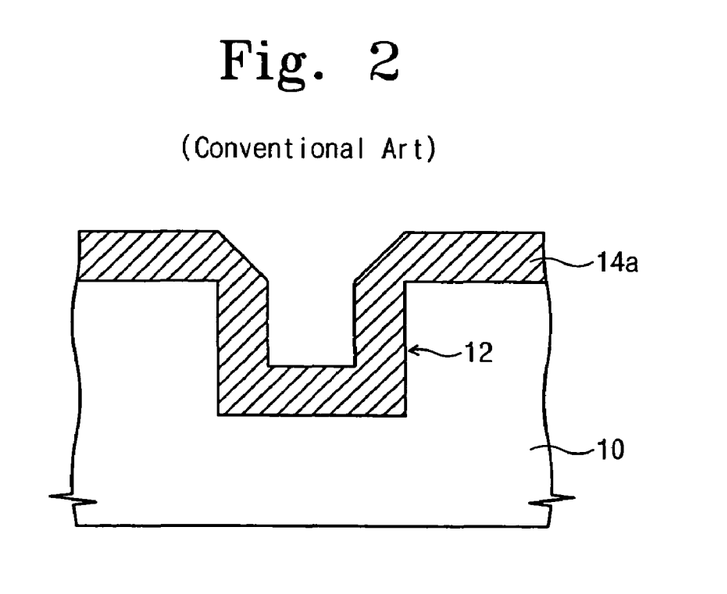
Figure 3:
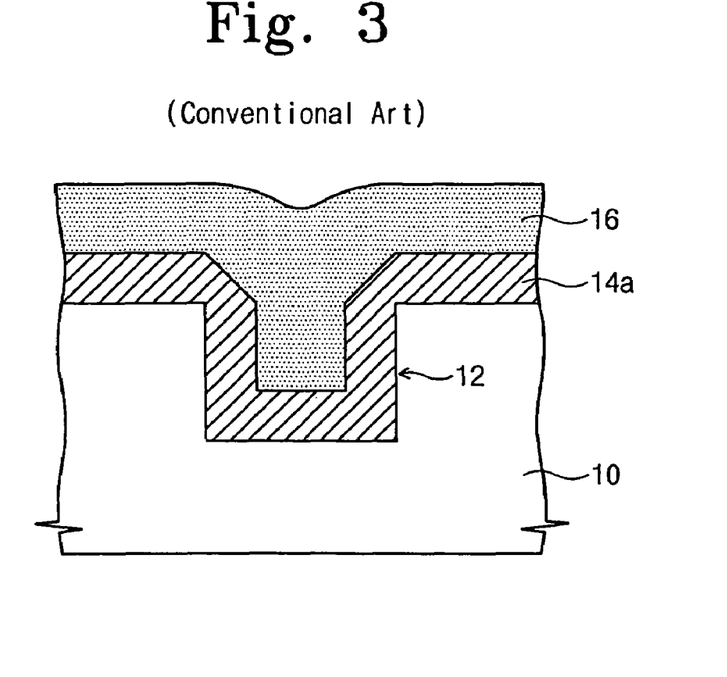

FIGS. 1 to 3 illustrate such a conventional gap-filling process. As shown in FIG. 1, an oxide is deposited on a substrate 10 to form a primary oxide layer 14 in trench 12. As shown in FIG. 2, part of the primary oxide layer 14 is removed by an etching process. As a result, an oxide layer pattern 14a defining a wide opening is formed at the top of the trench 12. Next, as shown in FIG. 3, a secondary oxide layer 16 is formed on the oxide layer pattern 14a to complete the burying of the trench 12.

However, in the etching process shown in FIG. 2, the oxide layer 14 is selectively removed by controlling the etching time, i.e., by a so called "timed etching" process. Moreover, the thickness of the oxide layer 14 may be irregular. In this case, the oxide layer pattern 14a formed by the timed etching process will have an irregular thickness.

Figure 4:
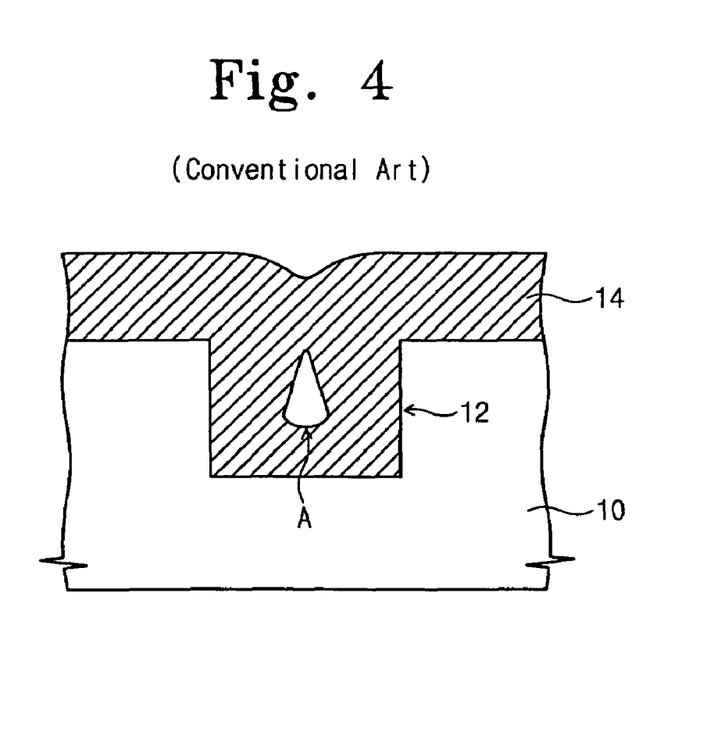
FIGS. 4 to 6 are each a cross-sectional view of part of a substrate and together illustrate a problem that may occur as the result of the timed etching employed in the conventional gap-fill process.
Figure 5:
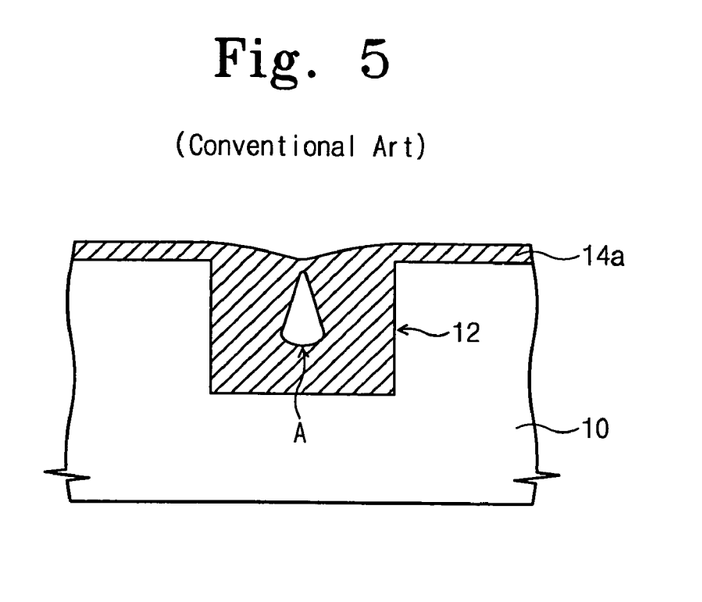
Figure 6:
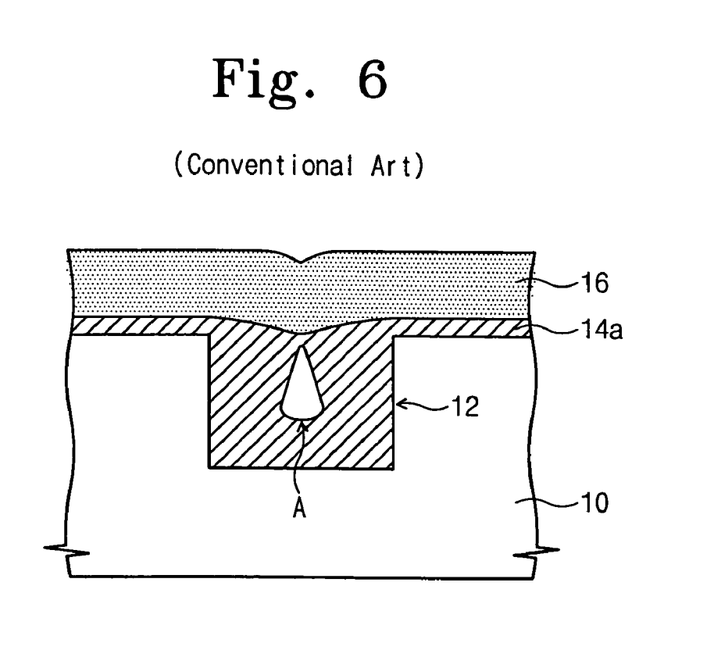

For example, as shown in FIG. 4, the primary oxide layer 14 may be formed to a thickness greater than the desired thickness such that voids A are formed in the primary oxide layer 14. As shown in FIG. 5, the voids A are not exposed even when the primary oxide layer 14 is etched, i.e., is subjected to a timed etching process. Accordingly, as shown in FIG. 6, the voids A remain in the trench 12 even after the secondary oxide layer 16 is formed on the oxide layer pattern 14a.

SUMMARY OF THE INVENTION

An object of the present invention is to provide a reliable gap-filling method, i.e., a reliable method of filling an opening in the manufacturing of a semiconductor device. Likewise, another object of the present invention is to provide an apparatus for use in the manufacturing of a semiconductor device and capable of performing a reliable gap-filling process.

Another object of the present invention is to provide an apparatus for use in manufacturing a semiconductor device capable of uniformly etching substrates such as semiconductor wafers in a process of filling an opening in a layer.

According to one aspect of the present invention, a semiconductor device manufacturing apparatus includes a chamber in which a wafer chuck is disposed, a plasma generator for generating plasma used to etch the wafer, an end-point detection unit for detecting the point at which the etching of the wafer is to be terminated, and a controller connected to the end-point detection unit. The end point detection unit monitors the etching process in the etching chamber and based on the monitoring instantaneously determines when the etching process is to be terminated.

Preferably, the endpoint detection unit includes a sensor, an analyzer operatively connected to the sensor, a data processor operatively connected to the analyzer, and an interface interconnecting the data processor and the controller. The sensor monitors a condition of the etching process. The analyzer analyzes the condition of the etching process detected by the sensor. The data processor is configured with algorithms that process the data to determine when the etching process is to be terminated. The data processor also outputs output an end-point detection when signal when it is determined that the etching process is to be terminated. The end-point detection signal when generated is transmitted to the controller through the interface.

The sensor of the end point detection unit may be an optical sensor that senses light produced in the chamber during the etching process. In this case, the analyzer determines the wavelength of light sensed by the optical sensor. Alternatively, the sensor of the end point detection unit may be a gas sensor that senses gas emitted in the chamber during the etching process. In this case, the analyzer determines characteristics of the gas sensed by the gas sensor in the chamber during the etching process.

According to another aspect of the present invention, a method for use in the manufacturing of a semiconductor device includes providing a first layer having an opening therein, forming a second layer on the first layer including within the opening and at a region outside the opening, subsequently removing material of the second layer, monitoring the structure at the region outside the opening as material of the second layer is being removed and generating in real time data representative of the structure, terminating the process of removing material of the second layer based on the data when the data reveals that a layer disposed under the second layer at the region outside the opening is being removed by the process, and subsequently forming a third layer on the second layer to complete a burying of the opening.

According to still another aspect of the present invention, a method for use in the manufacturing of a semiconductor device includes providing a substrate having a trench therein, sequentially depositing a trench oxide layer and a trench nitride layer on the substrate including over inner sidewalls of the substrate that define sides of the trench and at a region outside the trench, forming a first oxide layer on the trench nitride layer wherein the trench is not filled completely after the first oxide layer is formed, etching the resulting structure, monitoring the etching at the region outside the trench and generating in real time data representative of the layer that is being etched, terminating the etching of the first oxide layer when the data reveals that the trench nitride layer is being etched at the region outside the trench, and planarizing the resulting structure down to the substrate to form an isolation layer constituted by the parts of the first and second oxide layers which remain in the trench.

According to an aspect of the method present invention, the removal or etching process is preferably a plasma etching process using an etch gas, such as a fluorine-based etch gas. The monitoring process comprises sensing light, such as that produced by plasma, reflecting from the upper surface of the structure. The resulting data that is generated is representative of the wavelength of the reflected light. Alternatively, the monitoring process comprises sensing gas emitted from the structure as the structure is being etched. The resulting data that is generated is representative of the composition of the gas, e.g., is representative of the amount of at least one component of the gas.

BRIEF DESCRIPTION OF THE DRAWINGS

These and other objects, features and advantages of the present invention will become better understood from the following detailed description of the preferred embodiments thereof made with reference to the attached drawings. In the drawings.

DETAILED DESCRIPTION OF PREFERRED EMBODIMENTS

The present invention will be described below in more detail with reference to FIGS. 7-15.

Figure 7:
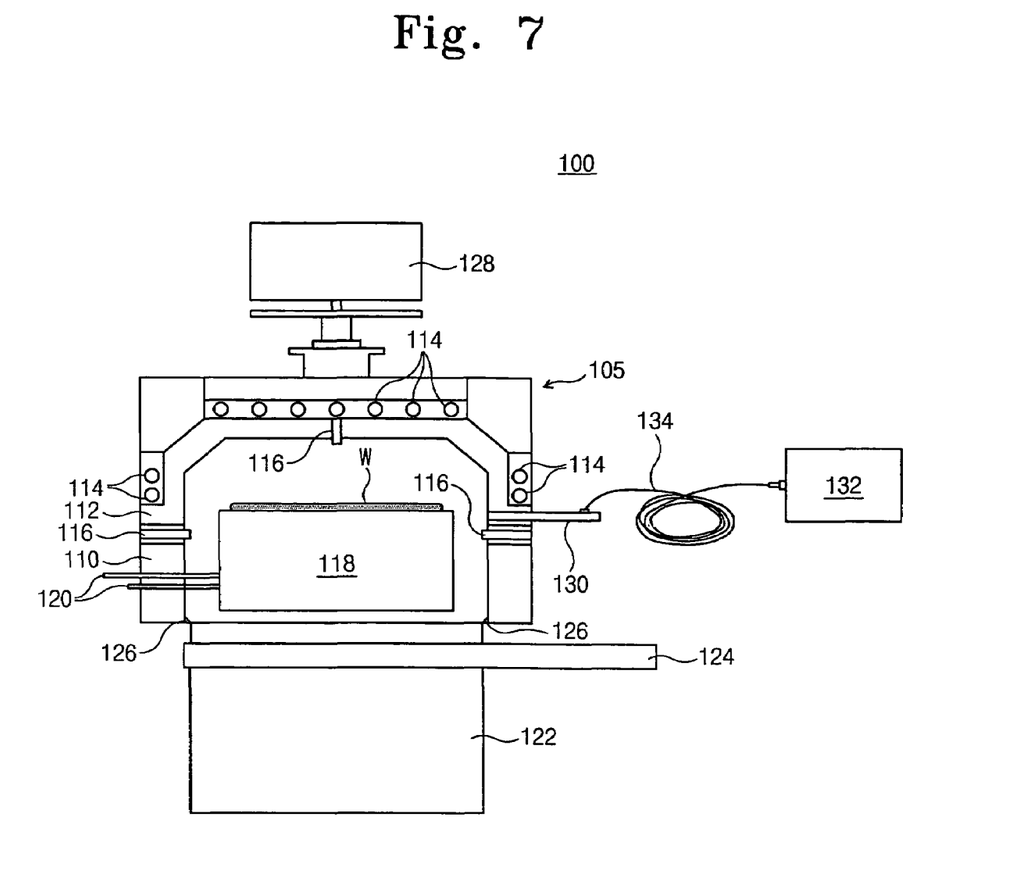
FIG. 7 is a sectional view of an embodiment of a semiconductor device manufacturing apparatus in accordance with the present invention.
Figure 8:
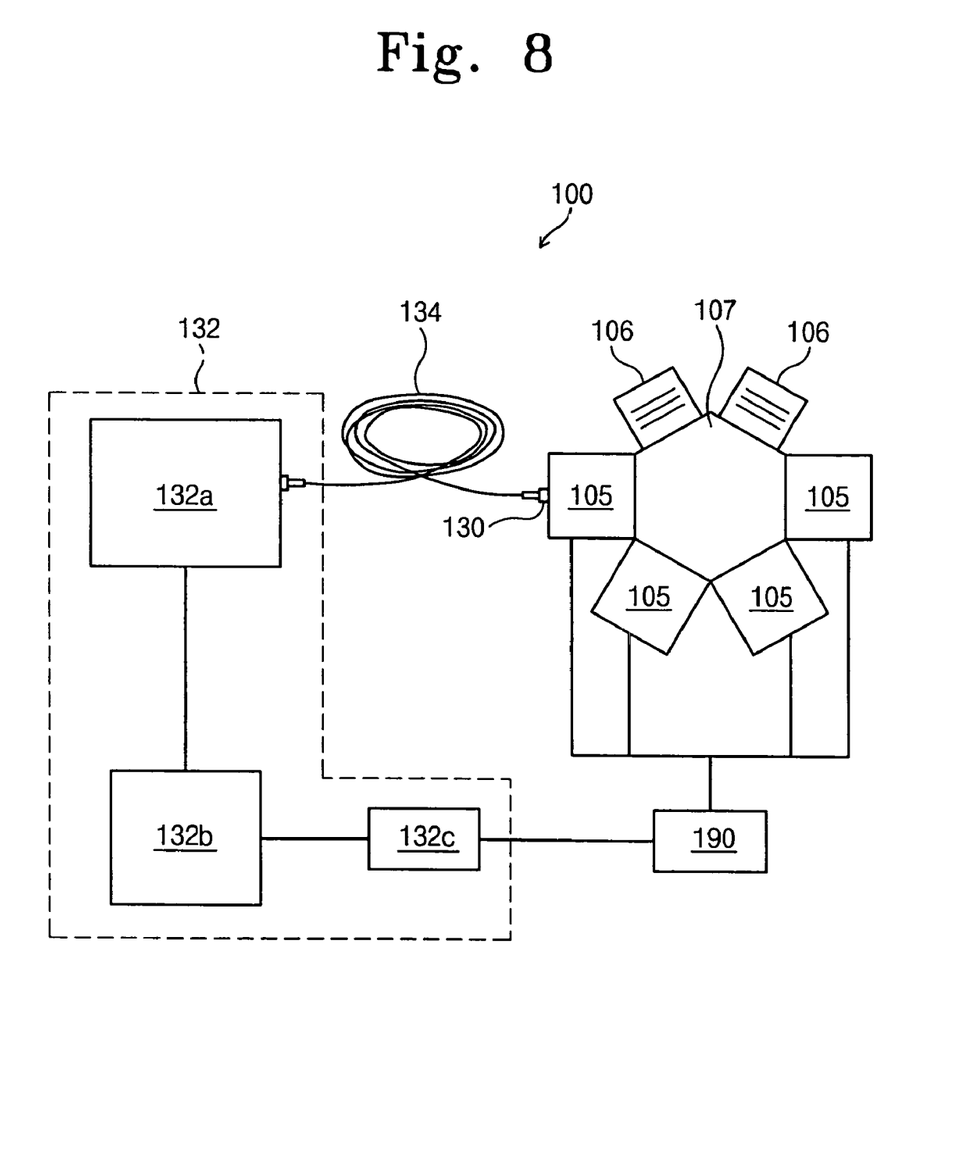
FIG. 8 is a schematic diagram of the semiconductor device manufacturing apparatus including an end-point detector in accordance with the present invention.

Referring to FIG. 8, a semiconductor device manufacturing apparatus 100 in accordance with the present invention may be of a cluster type that includes a plurality of process chambers 105, a transfer chamber 107 to which the process chambers 105 are connected in common, and one or more load-lock chambers 106. A robot is disposed in the transfer chamber 107 for transferring wafers between the load-lock and process chambers. At least one of the process chambers 105, as shown in more detail in FIG. 7, is a chamber in which an etch process is performed. The semiconductor device manufacturing apparatus 100 also includes an end-point detection (EPD) unit connected to this chamber 105.

Referring to FIG. 7, the chamber 105 is formed of a dome 112 fastened to a chamber body 110. The dome 112 may be of ceramics. A coil 114 is wound along the side and upper part of the dome 112. A radio frequency is applied to the coil 114. Gas injection nozzles 116 are disposed in the chamber 105 to introduce an etching gas such as a fluorine-based gas, e.g., $NF_3$, into the chamber 105. In this respect, the nozzles 116 are located at the side and at the top of the chamber 105, but the apparatus is not limited to such an arrangement of gas injection nozzles. The etching gas is produced by a remote generator 128 disposed over the chamber 105 and connected to the nozzles 116. Power is applied to the coil 114 once the etching gas produced the remote generator 128 is introduced into the chamber 105 through the nozzles 116, to thereby generate plasma in the chamber 105.

The semiconductor device manufacturing apparatus also has a chuck 118 disposed in the chamber 105 to support a substrate such as a silicon wafer W. The chuck 118 may be an electrostatic chuck for holding the wafer W in place using an electrostatic force. In addition, a nozzle 120 may be connected to the electrostatic chuck 118 to provide a cooling gas, such as helium, into two zones at the top of the electrostatic chuck 118 and hence, onto the wafer W. Accordingly, the wafer W can be prevented from deforming due to a high temperature atmosphere in the chamber 105 when the electrostatic chuck 118 is used.

A pump 122 is provided under the chamber 105 to evacuate the chamber 105. A gate valve 124 is disposed between the pump 122 and the chamber 105 to place the inlet of the pump 122 in communication with the chamber 105 when the pump 122 is operated. Moreover, two throttle valves 126 are disposed at bottom corners of the chamber 105 to regulate the pressure in the chamber 105. A controller (not shown in FIG. 7) controls the operation of the apparatus, such as the supplying of power to the coil 14, the operation of the pump 122, the positioning of the throttle valves, etc.

As mentioned above, the semiconductor device manufacturing apparatus also includes an end-point detection (EPD) unit. The EPD unit is for detecting a point in time at which the etching of the wafer W mounted on the chuck 118 is to be terminated. The end-point detection (EPD) unit of semiconductor device manufacturing apparatus will now be described in more detail with respect to FIGS. 7 and 8.

The EPD unit includes an end-point detection sensor 130 disposed on the side of the chamber 105 for detecting light or gas in the chamber 105, a controller 132, and an optical fiber 134 connecting the sensor 130 to the controller 132. The controller 132 includes an analyzer 123a for analyzing the light or gas detected by the sensor 130 and generating data representative thereof, a data processor 132b configured with end-point decision algorithms, and an interface 132c connected to the controller (190 in FIG. 8) so that signals can be transmitted between the controller 190 and the EPD unit.

The data processor 132b determines the point at which the etching process should be terminated on the basis of the data generated by the analyzer 132a, and outputs an end-point detection signal at such time. In this respect, the controller 190 receives the end-point detection signal through the interface 132c. The controller 190 controls the components of the semiconductor manufacturing apparatus, such as the power source for the coil 114 and/or a flow control valve interposed between the remote generator 128 and the nozzles 116, to interrupt or otherwise terminate the etching process when the end-point detection signal is generated by the data processor 132b.

A gap-filling method using the semiconductor device manufacturing apparatus comprising the EPD unit will now be described in conjunction with FIGS. 9 to 11. In this process, the gap may be a contact hole or a trench or the like formed in a layer. The layer may be a substrate or simply a layer of material formed on a substrate.

Figure 9:
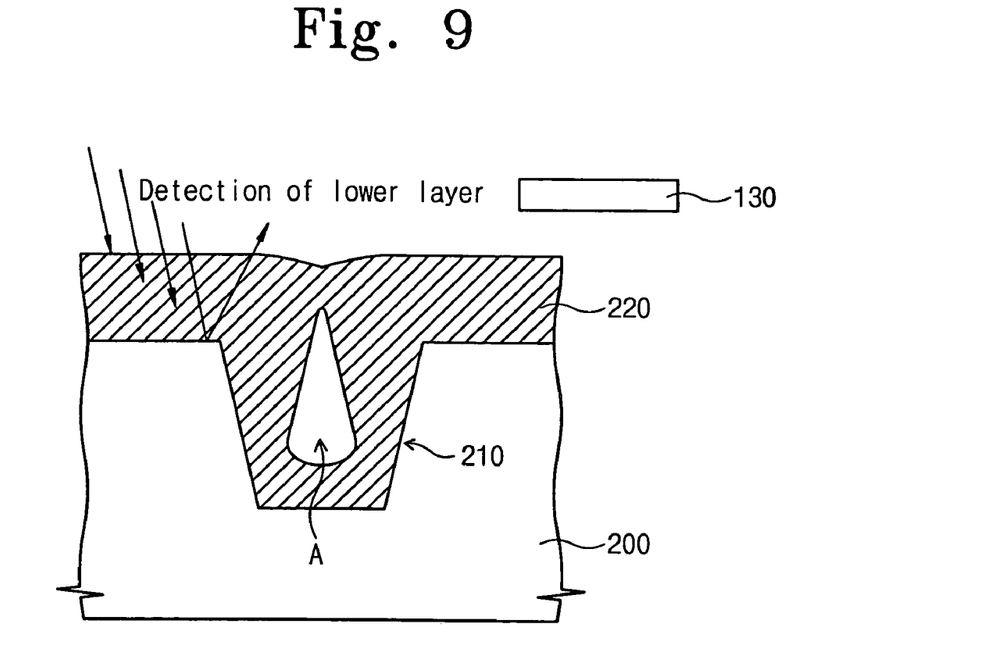
FIGS. 9 to 11 are each a cross-sectional view of part of a substrate and together illustrate an embodiment of a gap-fill process in accordance with the present invention.

Referring first to FIG. 9, a second layer 220 is formed by a deposition process on a first layer 200 to such a thickness that a gap 210 formed in the first layer 200 is buried. If the gap 210 has a certain depth, the second layer 220 may not fill the gap 210 completely, i.e., voids A are produced in the portion of the second layer 220 that occupies the gap 210. The voids A are produced especially when the depth of the gap 210 is much greater than the thickness to which the second layer 220 is deposited, or when the gap 210 has a high aspect ratio.

The second layer 220 is etched, after the deposition process, using an etching gas, until the first layer 200 is exposed unlike the timed etching process of the prior art in which the etching process is carried out for a predetermined period of time. The exposure of the first layer 200 is detected by the EPD unit.

In this respect, the sensor 130 may be an optical sensor capable of sensing light and is oriented to sense light reflecting from the upper surface of the semiconductor device structure in the chamber 105 as the second layer 220 is being etched. The light may originated from the plasma generated in the chamber 105 during the etching process. The analyzer 132a analyzes the light to determine the wavelength thereof. The data processor 132b detects a change in the wavelength of the light that occurs when the light, first reflecting from the second layer 220, begins to reflect from first layer 200, i.e., once the second layer 220 has been removed by the etching process from the upper surface of the first layer 200.

Alternatively, the sensor 130 is a gas sensor capable of sensing gas and the analyzer 132a is a gas analyzer capable of identifying the components of the gas. In this case, the gas is that emitted from the semiconductor device structure in the chamber 105 as the etching process is carried out on the structure. The gas emitted by the second layer 220 as it is etched is different than that emitted by the first layer 200 when it is etched due to the different compositions of the first and second layer 200, 220. The data processor 132b detects a change in the composition of the gas as the first layer begins to be etched, i.e., once the second layer 220 has been removed by the etching process from the upper surface of the first layer 200.

The EPD unit issues the end-point detection signal to the controller 190 when the wavelength of light reflected from the structure changes during the etching process or when the composition of gas emitted from the structure changes during the etching process. Consequently, the controller 190 terminates the etching process.

Figure 10:
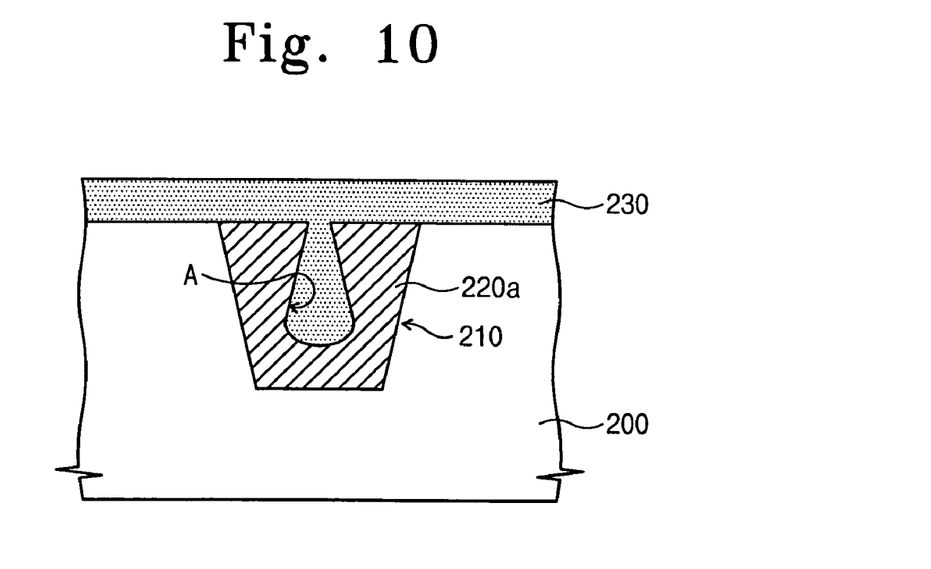

Referring to FIG. 10, the voids A in the etched second layer 220a are thus exposed. Subsequently, a third layer 230 is formed on the first layer 200 by a deposition process to complete the burying of the gap 210. At this time, the voids A are filled by the third layer 230 because the voids A are exposed.

Figure 11:
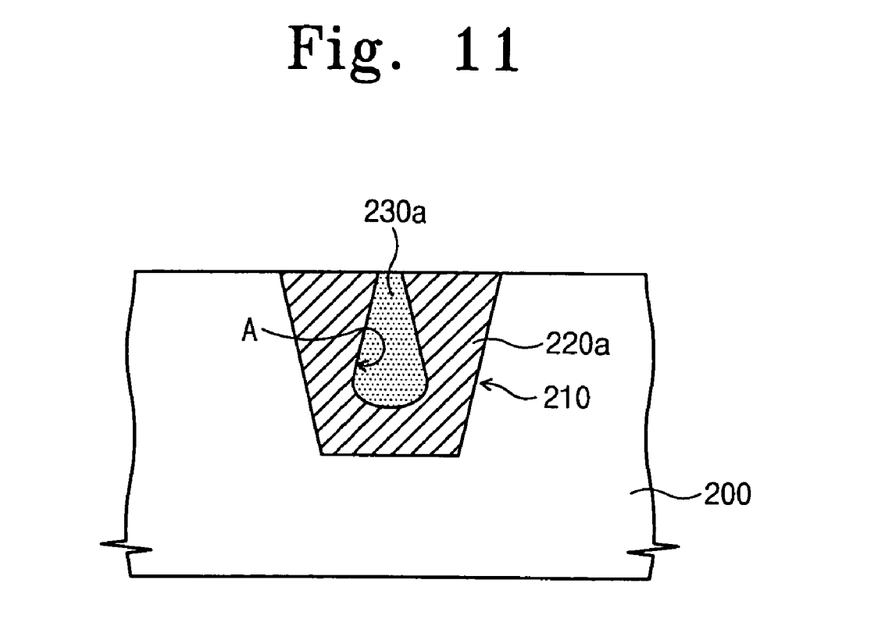

Referring to FIG. 11, the third layer 230 is removed using an etching process or a chemical mechanical polishing (CMP) process until the first layer 200 is exposed. Accordingly, the gap 210 in the first layer 200 remains completely buried. That is, the end-point detection method prevents voids from remaining in the structure after the gap is buried.

Another gap-filling method using the semiconductor device manufacturing apparatus will be described in conjunction with FIGS. 12 to 15. In this respect, the gap-filling method is performed in conjunction with the forming of an isolation structure, such as a shallow trench isolation structure.

Figure 12:
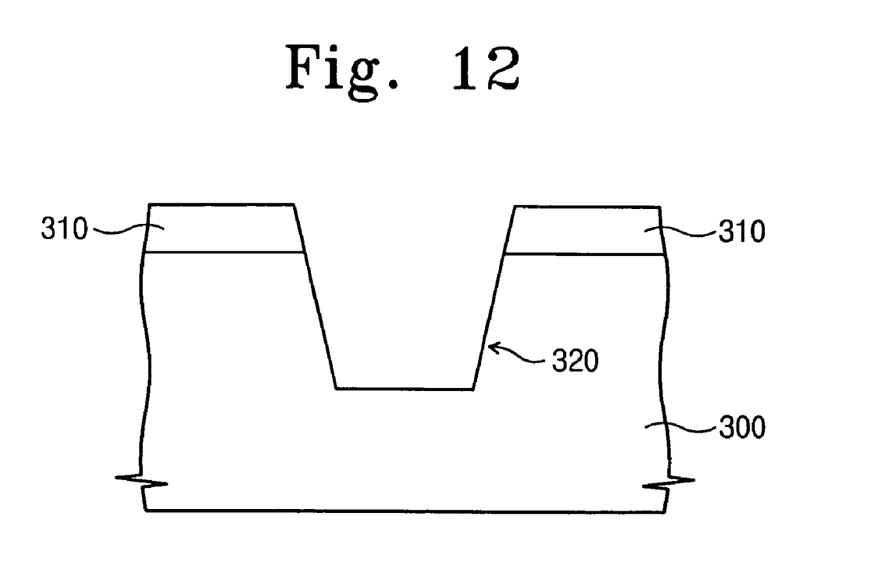
FIGS. 12 to 15 are each a cross-sectional view of a substrate and together illustrate another embodiment of a method of forming a trench isolation structure in accordance with the present invention.

Referring to FIG. 12, an active nitride layer 310 is formed and patterned on a silicon substrate such as a semiconductor wafer (hereinafter referred to as a wafer) 300 to define an active region of the wafer. The wafer 300 is etched using the patterned active nitride layer 310 as a mask, thereby forming a trench 320 to the side of the active region of the wafer 300.

Figure 13:
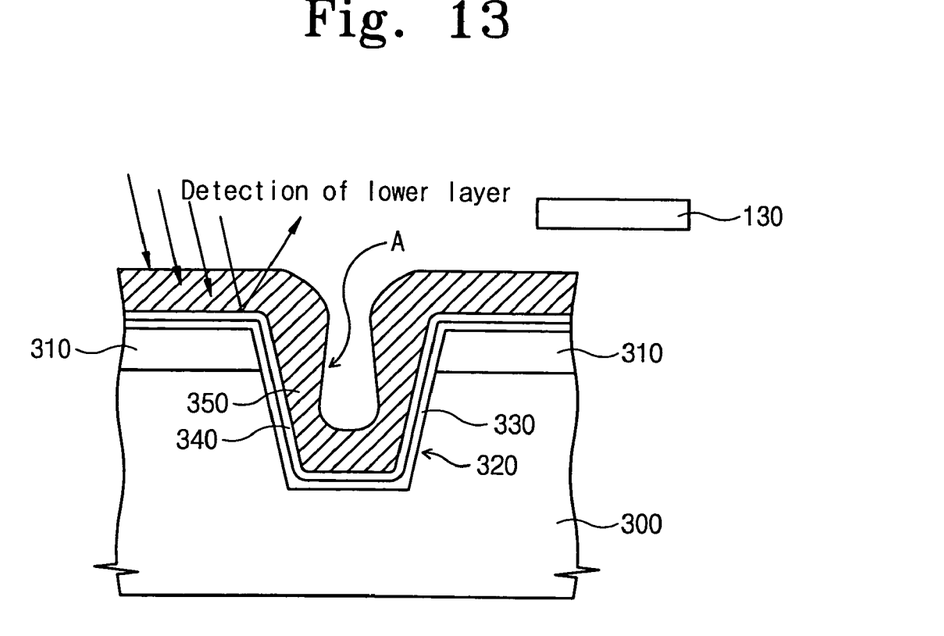

Referring to FIG. 13, a trench oxide layer 330 and a trench nitride layer 340 are formed on the wafer 300 including over surfaces that define the bottom and sides of the trench 320. Then, a first oxide layer 350 is formed on the wafer 300. The oxide layer 350 may be formed by a high-density plasma (HDP) oxide layer deposition process having good step coverage.

However, part of the trench 320 may remain unfilled due to the depth of the trench 320, i.e., if the trench is particularly deep and/or has a high aspect ratio. The unfilled part A has the potential to transform into voids during the subsequent process, which voids would degrade electrical characteristics of the final semiconductor device. The voids are produced especially when the depth of the trench 320 is much greater than the thickness to which the oxide layer 350 is deposited, or when the trench 320 has a high aspect ratio.

Next, the first oxide layer 350 is etched using an etching gas such as a fluorine-based gas, e.g., $NF_3$, until the trench oxide layer 340 is exposed. The exposure of the trench oxide layer 340 is detected by the EPD unit. Again, the sensor 130 may be an optical sensor capable of sensing light and is oriented to sense light reflecting from the upper surface of the semiconductor device structure in the chamber 105 as the oxide layer 350 is being etched by plasma. The analyzer 132a analyzes the light to determine the wavelength thereof. The data processor 132b detects a change in the wavelength of the light that occurs when the light, first reflecting from the first oxide layer 350, begins to reflect from the underlying trench oxide layer 340, i.e., once the oxide layer 350 has been removed by the etching process from the upper surface of the trench oxide layer 340. Alternatively, the sensor 130 is a gas sensor and the analyzer 132a is a gas analyzer capable of identifying the components of gas. The gas emitted by the trench oxide layer 340 as it is etched is different than that emitted by the first oxide layer 350 as it is etched due to differences in the oxides of the layers 340, 350. The data processor 132b detects a change in the composition of the gas as trench oxide layer 340 begins to be etched, i.e., once the first oxide layer 350 has been removed by the etching process from the upper surface of the trench oxide layer 340. In either case, the EPD unit issues the end-point detection signal to the controller 190, and the controller interrupts or otherwise terminates the etching process.

Figure 14:
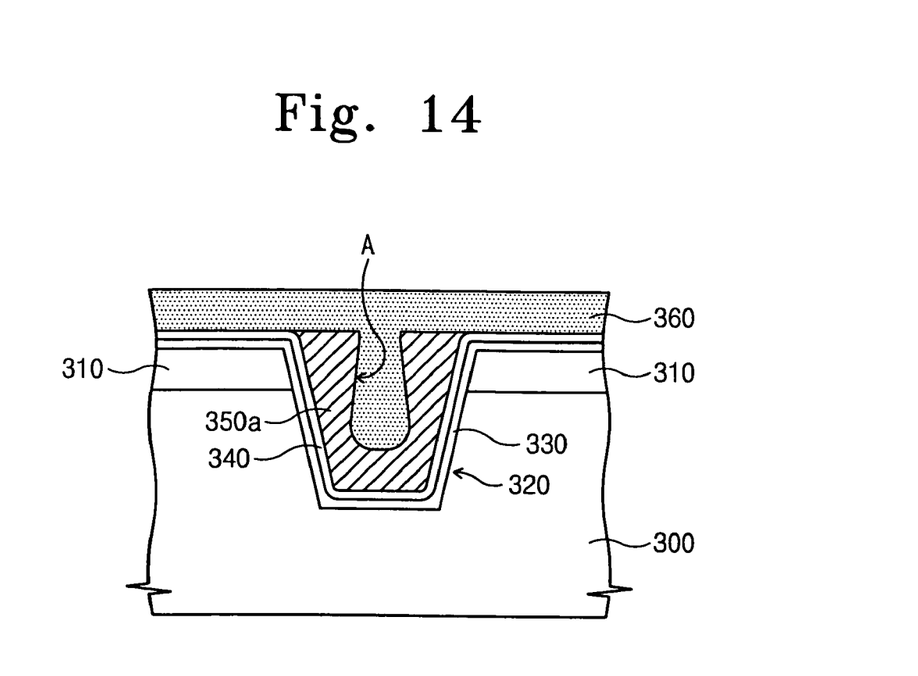

Referring to FIG. 14, the unfilled part A of the trench 320 remains exposed even after the etching process is terminated, i.e., after the etched first oxide layer 350a is formed. Subsequently, a second oxide layer 360 is formed by a deposition process on the trench oxide layer 340. In this respect, the second oxide layer 360 may be formed using a high-density plasma (HDP) oxide layer deposition process having good step coverage. Thus, at this time, the unfilled part A of the trench 320 is filled with the second oxide layer 360 to complete the burying of the trench 320.

Figure 15:
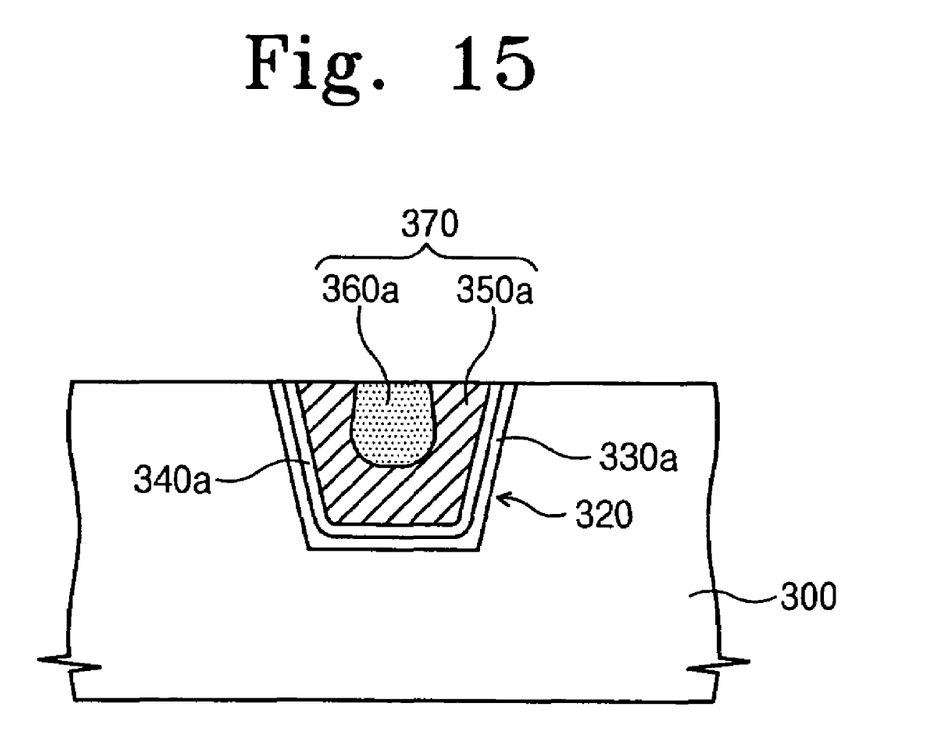

Referring to FIG. 15, the resulting structure is etched or polished by a CMP process to complete the forming of the trench isolation structure. An isolation layer 370 of the structure, constituted by the first oxide layer 350a and the second oxide layer 360a, is free of voids.

Therefore, according to the present invention as described above, the end point of the etching process is detected using a sensor. That is, an oxide layer is etched until a layer disposed under the oxide layer is exposed. As a result, a uniform etching effect is obtained despite any irregularity that may exist in the thickness of the oxide layer. Therefore, a reliable gap-filling process can be performed.

Finally, although the present invention has been described in connection with the preferred embodiments thereof, the present is not limited. Rather, various substitutions, modifications and changes as will be apparent to those skilled in the art that may be made to the disclosed embodiments without departing from the true spirit and scope of the invention as defined by the appended claims.

What is claimed is:

1. A semiconductor device manufacturing apparatus comprising:

an etching chamber;

a chuck disposed in the etching chamber to support a substrate to be etched in the chamber;

a plasma generator operatively associated with the chamber to produce plasma from an etching gas, and provide the plasma within the etching chamber to etch a substrate supported on the chuck;

an end point detection unit that monitors the etching process in the etching chamber and based on the monitoring instantaneously determines when the etching process is to be terminated, the end point detection unit comprising a sensor mounted to the etching chamber and exposed to the interior of the chamber so as to sense directly a condition of the etching process as the process progresses in the etching chamber; and a controller operatively connected to the end point detection unit and to the plasma generator so as to turn off the plasma generator when the end point detection unit determines that the etching process is to be terminated.

2. The semiconductor device manufacturing apparatus according to claim 1, wherein the the sensor is an optical sensor that senses light produced in the chamber during the etching process.

3. The semiconductor device manufacturing apparatus according to claim 2, wherein the end point detection unit further comprises an analyzer connected to the optical sensor to determine the wavelength of light sensed by the optical sensor in the chamber during the etching process.

4. The semiconductor device manufacturing apparatus according to claim 1, wherein the the sensor is a gas sensor that senses gas emitted in the chamber during the etching process.

5. The semiconductor device manufacturing apparatus according to claim 4, wherein the end point detection unit further comprises an analyzer connected to the gas sensor to determine characteristics of the gas sensed by the gas sensor in the chamber during the etching process.

6. The semiconductor device manufacturing apparatus according to claim 1, wherein the end point detection unit further comprises:

an analyzer operatively connected to the sensor to analyze the condition of the etching process detected by the sensor, and generate data representative of an analysis of the condition;

a data processor operatively connected to the analyzer so as to receive the data generated by the analyzer, configured with algorithms that process the data to determine when the etching process is to be terminated, and operative to output an end-point detection when signal when it is determined that the etching process is to be terminated; and an interface interconnecting the data processor and the controller such that end-point detection signal when generated is transmitted to the controller.

7. The semiconductor device manufacturing apparatus according to claim 1, wherein the plasma generator comprises:

a source of the etching gas; and a coil through which power required to excite the etching gas and thereby generate the plasma is applied.

8. The semiconductor device manufacturing apparatus according to claim 7, further comprising:

a pump connected to the chamber to evacuate the chamber;

a gate valve interposed between the pump and the chamber to selectively place an inlet of the pump in open communication with the interior of the chamber; and a throttle valve connected to the chamber and operative to adjust the rate at which the chamber is evacuated, whereby the pressure in the chamber can be regulated.

* * * * *